(12) United States Patent
Hatipoglu (10) Patent No.: US 10,063,978 B2
(45) Date of Patent: Aug. 28, 2018

(54) CANTILEVERED SHEAR RESONANCE MICROPHONE

(71) Applicants: Akustica, Inc., Pittsburgh, PA (US); Robert Bosch GmbH, Stuttgart (DE)

(72) Inventor: Gokhan Hatipoglu, Pittsburgh, PA (US)

(73) Assignees: Akustica, Inc., Pittsburgh, PA (US); Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/263,765

(22) Filed: Sep. 13, 2016

(65) Prior Publication Data

US 2018/0077497 A1 Mar. 15, 2018

(51) Int. Cl.
| | |
|---|---|
| H04R 3/00 | (2006.01) |
| H04R 17/10 | (2006.01) |
| H03H 9/17 | (2006.01) |
| H03H 9/02 | (2006.01) |
| H03H 9/125 | (2006.01) |
| H04R 3/06 | (2006.01) |
| H03H 9/15 | (2006.01) |

(52) U.S. Cl.
CPC ......... *H04R 17/10* (2013.01); *H03H 9/02244* (2013.01); *H03H 9/125* (2013.01); *H03H 9/17* (2013.01); *H04R 3/06* (2013.01); *H03H 2009/155* (2013.01); *H04R 2201/003* (2013.01)

(58) Field of Classification Search
None
See application file for complete search history.

(56) References Cited

U.S. PATENT DOCUMENTS

| | | |
|---|---|---|
| 5,455,475 A | 10/1995 | Josse et al. |
| 2007/0287233 A1 | 12/2007 | Zhan et al. |
| 2008/0202239 A1* | 8/2008 | Fazzio ............... G01C 19/56 73/504.18 |
| 2011/0012478 A1* | 1/2011 | Najafi ............... B81C 1/0019 310/334 |

(Continued)

OTHER PUBLICATIONS

Hatipoglu, Gokhan et al., Experimental Studies in Magnetically Induced Transverse Force-frequency Effect in Thin Quartz Microresonators, Journal of Applied Physics, vol. 118, 034508, pp. 1-8, Jul. 7, 2015, AIP Publishing LLC.

(Continued)

*Primary Examiner* — James Mooney
(74) *Attorney, Agent, or Firm* — Maginot Moore & Beck LLP (57) ABSTRACT

A MEMS microphone includes a base structure and a piezoelectric resonator body having a first end and a second end. The first end is fixedly supported by the base structure and the second end is free such that the piezoelectric resonator is cantilevered from the base structure. The MEMS microphone further includes a first electrode operably connected to the piezoelectric resonator body and a second electrode operably connected to the piezoelectric resonator body. A controller includes at least one circuit operably connected to the first and second electrodes and configured to drive the piezoelectric resonator body at a shear resonance frequency of the piezoelectric resonator body and to detect a difference in the shear resonance frequency from a baseline resonance frequency resulting from a sound pressure.

18 Claims, 5 Drawing Sheets

(56) References Cited

U.S. PATENT DOCUMENTS

| | | |
|---|---|---|
| 2012/0195797 A1 | 8/2012 | Sparks et al. |
| 2014/0166618 A1 | 6/2014 | Tadigadapa et al. |
| 2015/0215706 A1 | 7/2015 | Sparks et al. |
| 2017/0099040 A1* | 4/2017 | Obata ................. H03H 9/19 |

OTHER PUBLICATIONS

Hatipoglu, Gokhan et al., Micromachined Magnetoflexoelastic Resonator Based Magnetometer, Applied Physics Letters, vol. 107, 192406, pp. 1-5, Nov. 13, 2015, AIP Publishing LLC.

* cited by examiner

CANTILEVERED SHEAR RESONANCE MICROPHONE

TECHNICAL FIELD

This disclosure relates generally to microphones and in particular to MEMS microphones.

BACKGROUND

Micro-electro-mechanical systems ("MEMS") microphones are used in a variety of fields to detect sound waves. Conventional MEMS microphones utilize a transduction method based on electrostatic sensing. In particular, one type of MEMS microphone uses a flexible moving diaphragm that forms one plate of a capacitor. The diaphragm moves relative to a fixed counter electrode that forms an opposite plate of the capacitor. As sound waves interact with the flexible diaphragm, the distance between the diaphragm and the counter electrode changes, thereby modifying the voltage/charge across the capacitor. Typically, a control circuit detects the changing voltage/charge across the capacitor and converts the detected voltage/charge into an electrical signal that is representative of the detected sound waves.

Diaphragm-type MEMS microphones are unsuitable for some applications, because the microphones exhibit viscous losses and thin-film squeezing damping, both of which negatively affect the detection of sound waves and decrease the signal to noise ratio ("SNR") and the sensitivity of the microphone. Moreover, diaphragm-type MEMS microphones are susceptible to particles landing on the diaphragm, which can result in shorts and leakage paths between the diaphragm and the counter electrode, which may interfere with proper detection of the sound waves by the control circuit.

Another type of MEMS microphone is a piezoelectric-based MEMS microphone. The typical piezoelectric-based MEMS microphone utilizes a transduction method based on the piezoelectric effect. For example, the typical piezoelectric-based MEMS microphone includes a piezoelectric body connected to two electrodes. The piezoelectric body is vibrated by sound waves, which cause the piezoelectric body to deform. According to the piezoelectric effect, the deformation of the piezoelectric body produces a net charge between the electrodes that is detected by a control circuit, and which corresponds to the detected sound waves.

The typical piezoelectric-based MEMS microphone is subject to intrinsic material losses in the piezoelectric material of the piezoelectric body. The material loss typically negatively affects the electrical impedance and the quality factor of the piezoelectric body and may also change or otherwise negatively affect the resonance frequency of the MEMS microphone, thereby resulting in a microphone that degrades in performance over time.

What is needed, therefore, is a MEMS microphone that overcomes at least some of the shortcomings of known MEMS microphones.

SUMMARY

A MEMS microphone includes a base structure and a piezoelectric resonator body having a first end and a second end. The first end is fixedly supported by the base structure and the second end is free such that the piezoelectric resonator is cantilevered from the base structure. The MEMS microphone further includes a first electrode operably connected to the piezoelectric resonator body and a second electrode operably connected to the piezoelectric resonator body. A controller includes at least one circuit operably connected to the first and second electrodes and configured to drive the piezoelectric resonator body at a shear resonance frequency of the piezoelectric resonator body and to detect a difference in the shear resonance frequency from a baseline resonance frequency resulting from a sound pressure.

In one embodiment of the MEMS microphone, the piezoelectric resonator body is formed in a plane and the controller is configured to drive the piezoelectric resonator body to resonate in the plane of the piezoelectric resonator body.

In another embodiment, the piezoelectric resonator body is configured such that the sound pressure deflects the piezoelectric resonator body at least partially out of the plane, causing the difference in the shear resonance frequency from the baseline resonance frequency.

In further embodiments of the MEMS microphone, the piezoelectric resonator body and the base structure are integrally formed from a common substrate.

In one embodiment, an acoustic leak path is defined separating the second end of the piezoelectric resonator body from the base structure.

In another embodiment, the acoustic leak path is defined having an arcuate shape, and the acoustic leak path surrounds an arc of between approximately 300 degrees and approximately 350 degrees around the piezoelectric resonator body.

In yet another embodiment of the MEMS microphone, the piezoelectric resonator body is formed of AT cut quartz crystal.

In a further embodiment, the first electrode is plated on a first side of the piezoelectric resonator body and the second electrode is plated on a second opposite side of the piezoelectric resonator body.

The first and second electrodes of some embodiments of the MEMS microphone each include a circular electrode portion, and the circular electrode portion of the first electrode has a different surface area than the circular electrode portion of the second electrode.

In one embodiment, the first and second electrodes are at least partially formed of one of copper, platinum, chrome, and gold.

In some embodiments of the MEMS microphone, the controller includes one of an impedance circuit, an RLC circuit, and an oscillator circuit configured to drive piezoelectric resonator body.

In yet another embodiment, the controller includes a frequency to voltage converter configured to detect the difference in the resonance frequency from the baseline resonance frequency caused by the sound pressure.

The controller of another embodiment of the MEMS microphone is further configured to track admittance or scattering parameters to determine a characteristic of the sound pressure from the determined difference in the resonance frequency from the baseline resonance frequency.

In another embodiment according to the disclosure, a method of producing a MEMS microphone comprises removing a portion of a piezoelectric substrate to form a thin substrate portion, forming first and second electrodes on the thin substrate portion, and defining an acoustic leak path in the thin substrate portion so as to form a piezoelectric resonator body supported at one end in a cantilevered manner by a base portion of the thin substrate portion.

In one embodiment, the defining of the acoustic leak path further comprises removing a portion of the thin substrate portion with a focused ion beam.

In a further embodiment of the method of producing the MEMS microphone, the removing of the portion of the piezoelectric substrate comprising etching the piezoelectric substrate in a reactive ion etching process.

In yet another embodiment of producing the MEMS microphone, the forming of the first and second electrodes comprising plating the first electrode on a first side of the thin substrate portion and plating the second electrode on a second opposite side of the thin substrate portion.

In another embodiment according to the disclosure, a method of detecting sound comprises driving, with a controller, a piezoelectric resonator body that is supported from a base portion in a cantilevered manner to resonate at a shear resonance frequency, the piezoelectric resonator body being operably connected to the controller by a first electrode and a second electrode. The method further includes detecting, with the controller, a frequency shift of the shear resonance frequency from a baseline resonance frequency resulting from sound pressure acting on the piezoelectric resonator body, and determining, with the controller, at least one sound characteristic based on the detected frequency shift.

DETAILED DESCRIPTION

For the purposes of promoting an understanding of the principles of the embodiments described herein, reference is now made to the drawings and descriptions in the following written specification. No limitation to the scope of the subject matter is intended by the references. This disclosure also includes any alterations and modifications to the illustrated embodiments and includes further applications of the principles of the described embodiments as would normally occur to one skilled in the art to which this document pertains.

As used herein, the term "approximately" is defined to refer to values within five percent less than or greater than the given value or, for angular values, angles within five degrees less than or greater than the given angle.

Figure 1A:
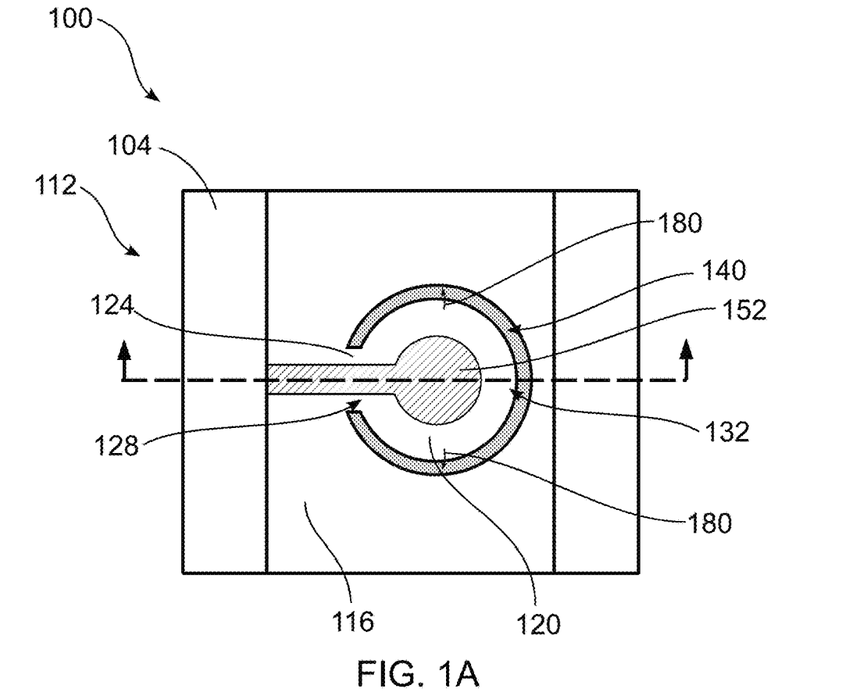
FIG. 1A is a top view of a MEMS microphone according to the disclosure having a cantilevered resonator body.
Figure 1B:
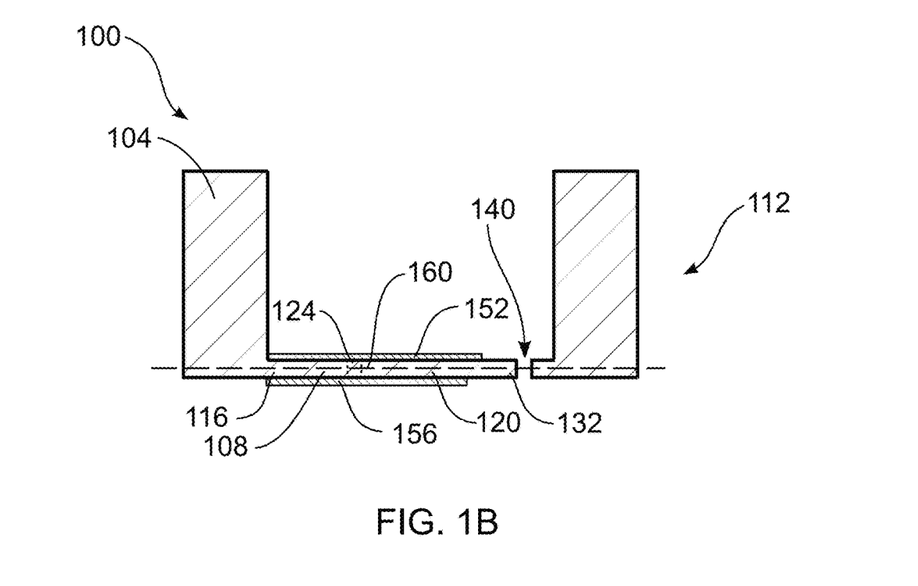
FIG. 1B is a side cross-sectional view of the MEMS microphone of FIG. 1A.

FIGS. 1A and 1B illustrate a micro-electro-mechanical ("MEMS") microphone 100 according to the disclosure. The MEMS microphone 100 includes a support body 104 and a thin substrate portion 108. In the illustrated embodiment, the support body 104 and the thin substrate portion 108 are both integrally formed from a single substrate 112. In other embodiments, however, the support body 104 may be a discrete element from the thin substrate portion 108, and may be attached to the thin substrate portion 108 in any suitable manner.

Figure 8:
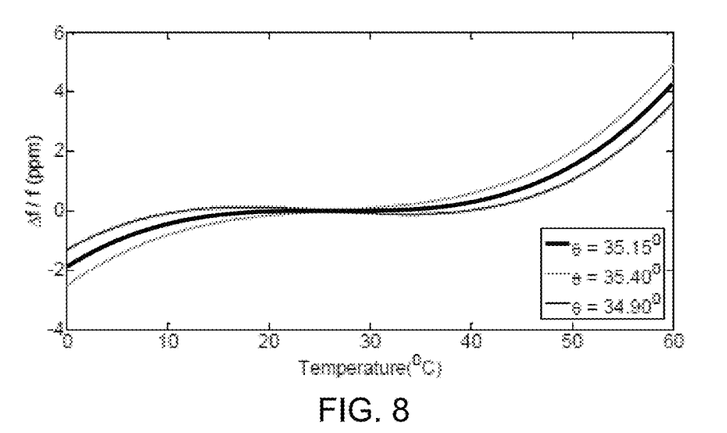
FIG. 8 is a graph showing the temperature sensitivity of AT cut quartz crystal within cut angle tolerances.

In one embodiment, the single substrate 112 is an AT cut quartz crystal wafer, which has a high quality factor and a low temperature sensitivity. For example, as illustrated in FIG. 8, the temperature sensitivity of AT cut quartz ($\theta$=35.150 in FIG. 8) is within ±2 ppm between 10° C. and 50° C. In other embodiments, however other quartz crystal cuts are used, for example SC, BT, or IT cut quartz crystals. In further embodiments, other suitable materials having a high quality factor are used, for example lithium niobate.

In one embodiment, the support body 104 has a thickness in the vertical direction (as shown in FIG. 1B) of approximately 100 microns, while the thin substrate portion 108 has a thickness in the vertical direction of between approximately 7-8 microns. However, in other embodiments, other suitable thicknesses are used for the support body 104 and the thin substrate portion 108.

The thin substrate portion 108 includes a base portion 116 and a resonator body 120 connected to one another by a connecting portion 124. The base portion 116 connects the support body 104 to the connecting portion 124 and the resonator body 120. The resonator body 120 is only supported at the connection with the connecting portion 124, resulting in the resonator body 120 attached to the connecting portion 124 in a cantilevered manner. The resonator body 120 has a first end 128 fixed at the connection with the connecting portion 124 and a second opposite end 132 that is free to move within and out of the plane 160 of the resonator body 120. The resonator body 120 is partially surrounded by an opening, or acoustic leak path 140, defined between the resonator body 120 and the base portion 116. In one embodiment, the acoustic leak path 140 is arcuate and extends between approximately 300 degrees and approximately 350 degrees around the resonator body 120.

With continuing reference to FIGS. 1A and 1B, the microphone 100 further includes a first electrode 152 and a second electrode 156 plated on the top side and the bottom side, respectively, of the thin substrate portion 108. Each of the first and second electrodes 152, 156 has a generally circular portion on the resonator body 120 and an elongated portion extending from the resonator body 120 to the support portion 116. In one embodiment, one or both of the electrodes 152, 156 are formed at least partially or entirely of gold, while in another embodiment one or both of the electrodes 152, 156 are formed at least partially or entirely of chromium. In a further embodiment, at least one of the electrodes 152, 156 is formed at least partially or entirely from platinum.

In addition, in some embodiments, the circular portion of the first electrode 152 has a different size compared to the circular portion of the second electrode 156 to reduce energy losses and avoid fringing fields between the electrodes 152, 156. For example, in the embodiment illustrated in FIG. 1B, the bottom electrode 156 is smaller than the top electrode 152. In one embodiment, the area of the circular portion of the bottom electrode 156 may be between approximately half the area of the circular portion of the top electrode 152 and approximately three-quarters the area of the circular portion of the top electrode 152. In another embodiment, the area of the circular portion of the bottom electrode 156 may be larger than the area of the circular portion of the top electrode, for example between approximately 50% larger and approximately 100% larger than the area of the circular portion of the top electrode 152.

Figure 2:
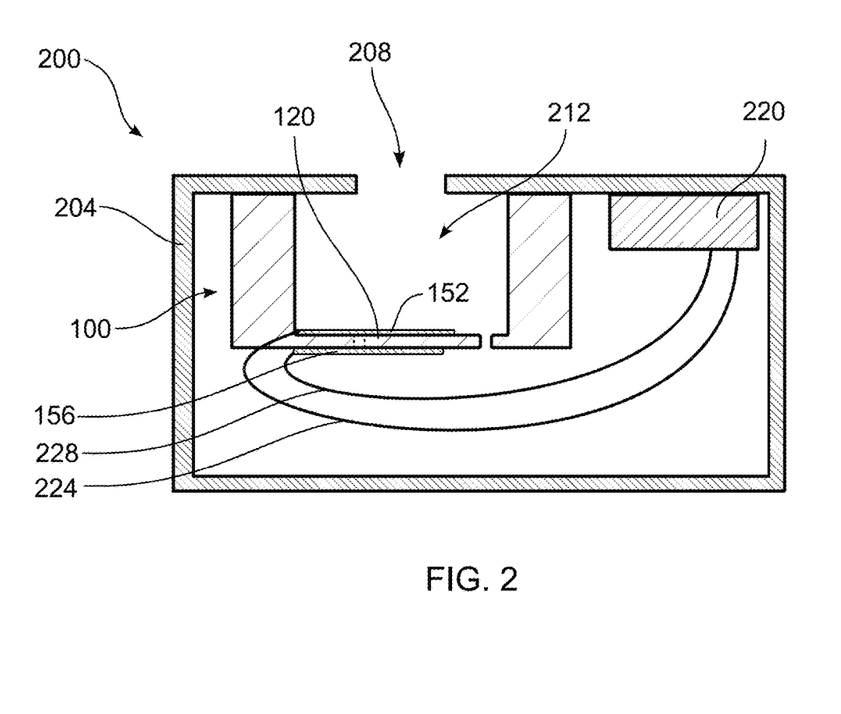
FIG. 2 is a side cross-sectional view of a microphone package having the MEMS microphone of FIG. 1A.

FIG. 2 illustrates one example of the MEMS microphone 100 arranged in a microphone package 200. The microphone package 200 includes an enclosure 204 to which the MEMS microphone 100 is affixed so as to retain the MEMS microphone 100 in a fixed position relative to the enclosure 204. The enclosure 204 defines a port hole 208, through which sound waves are transmitted into a front cavity 212 that is defined between the enclosure 204 and the resonator body 120.

The electrodes 152, 156 of the MEMS microphone 100 are operably connected to a controller circuit 220, also referred to herein as a controller or a detection circuit, in the enclosure 204. In the illustrated embodiment, the electrodes 152, 156 are connected to the controller circuit 220 via wire bonds 224, 228, though other suitable connections between the electrodes 152, 156 and the controller circuit 220 are utilized in other embodiments.

The controller circuit 220 is configured to aid in operation and control of the MEMS microphone 100. The controller circuit 220 is implemented with general or specialized programmable processors that execute programmed instructions. The instructions and data required to perform the programmed functions are stored in a memory (not shown) associated with the controller circuit 220. The processors, the memory, and interface circuitry configure the controller circuit 220 to perform the functions and the processes described below. These components can be provided on a printed circuit card or provided as a circuit in an application specific integrated circuit (ASIC). Each of the circuits can be implemented with a separate processor or multiple circuits can be implemented on the same processor. Alternatively, the circuits can be implemented with discrete components or circuits provided in VLSI circuits. Also, the circuits described herein can be implemented with a combination of processors, ASICs, discrete components, or VLSI circuits.

Figure 3:
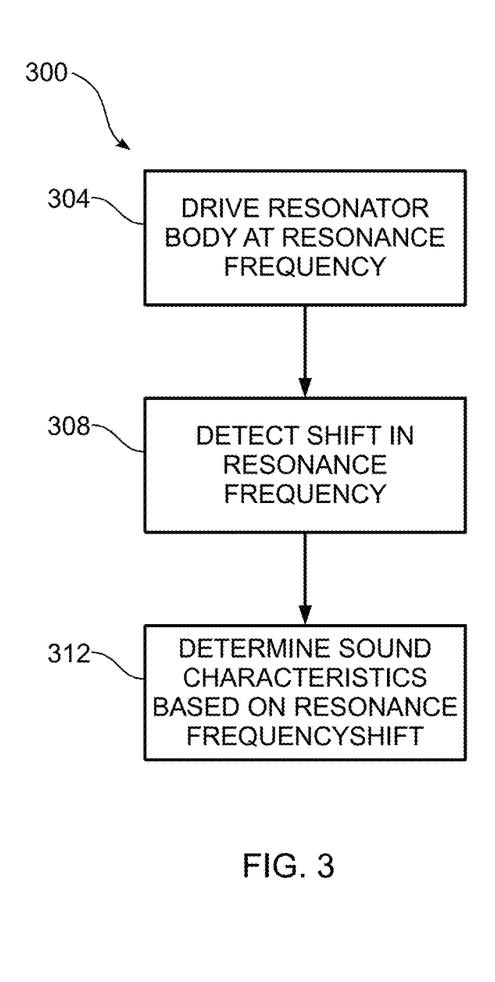
FIG. 3 is a process diagram of a method of detecting sound with a MEMS microphone such as the MEMS microphone of FIG. 1A.

FIG. 3 illustrates one process 300 of operating the MEMS microphone 100 using the controller circuit 220. The process 300 begins with the controller circuit 220 operating to drive the piezoelectric resonator body 120 at the shear resonance frequency of the piezoelectric resonator body 120 (block 304). The shear resonance frequency is also referred to herein as a shear resonant frequency. The controller circuit 220 transmits a sinusoidal electrical input voltage to the piezoelectric resonator body 120 via the electrodes 152, 156. The piezoelectric properties of the resonator body 120 cause the resonator body 120 to oscillate in direction 180 (shown in FIG. 1A) in response to the applied voltage within the plane of the resonator body 120 (e.g. in the vertical plane 160 as seen in FIG. 1B). The voltage applied is selected to cause the piezoelectric resonator body 120 to resonate at the shear resonance frequency of the resonator body 120. In one embodiment, the controller circuit 220 includes an impedance circuit, an oscillator circuit, or an RLC circuit that provides the voltage to cause the resonator body 120 to resonate at the resonance frequency.

Sound pressure entering through the port hole 208 into the cavity 212 acts on the piezoelectric resonator body 120 and causes the resonator body 120 to deform in a direction away from the plane of the resonator body 120, for example upwardly or downwardly in the view of FIG. 1B. The deformation out of the plane alters or modulates the shear resonance frequency of the resonator body 120 as a function of the characteristics of the sound pressure, for example the sound pitch, frequency, and/or amplitude of the sound. The controller circuit 220 is configured to detect a shift of the resonance frequency of the resonator body 120 from a baseline resonance frequency caused by sound pressure (block 308), in a transduction process referred to herein as a force-frequency effect of the piezoelectric resonator body 120. That is, as a result of an applied force (i.e. sound waves) the resonator body 120 bends out of a plane in which the resonator body 120 is located when no sound waves are applied thereto. The bending of the resonator body 120 results in a change in the resonance frequency of the resonator body 120 due at least in part to the force-frequency effect. The control circuit 220 detects the change in resonance frequency and converts the detected change in resonance frequency to an electrical signal that corresponds to the detected sound waves that the caused the resonator body 120 to bend.

In one embodiment, the controller circuit 220 includes a frequency to voltage converter integrated circuit that detects the shift in the resonance frequency. In another embodiment, the controller circuit 220 includes an impedance circuit, oscillator circuit, or analyzer circuit configured to determine the shift in the resonance frequency of the resonator body 120 via the electrodes 152, 156. The controller circuit 220 may determine the shift in the resonance frequency by tracking scattering parameters, impedance parameters, or admittance parameters of the resonator body 120. In other embodiments, the same impedance circuit or oscillator circuit used to apply the voltage to the resonator body also detects the frequency shift via the electrodes 152, 156.

The controller circuit 220 is further configured to determine one or more sound characteristics based on the shift in the shear resonance frequency of the piezoelectric resonator body 120 (block 312). In one embodiment, the controller circuit 220 detects the sound frequency and amplitude based on the shift in the shear resonance frequency of the piezoelectric resonator body 120.

The controller circuit 220 tracks the scattering parameters or the admittance parameters (i.e the conductance (G) and susceptance (B) or resistance (R) and reactance (X)) within a predetermined range of frequencies. According to an example, the frequency at which the conductance has the greatest magnitude is based on the magnitude of an input sound pressure level ("SPL"). As the magnitude of the input SPL fluctuates, so too does the frequency at which the magnitude of the conductance is greatest. The controller circuit 220 is configured to track the magnitude of the conductance for the predetermined range of frequencies and to determine the frequency at which the magnitude of the conductance has the greatest value or has an optimized value. According to another example, the controller circuit 220 tracks the admittance parameters at a single frequency, which is referred to herein as a tracking frequency. The magnitude of the admittance parameters at the tracking frequency is based on the magnitude of the input SPL. For example, the controller circuit 220 tracks the conductance at a shear resonance frequency (i.e. the tracking frequency)

that is selected to be within a range of about 150-250 MHz depending on the thickness of the resonator body 120. The magnitude of the tracked admittance parameters (conductance in the above example) changes as a function of the magnitude of the input SPL, and the controller circuit 220 is configured to determine the frequency that results in an optimized value of the tracked admittance parameters. Depending on the selected tracked admittance parameter, the optimized value may be a maximum value, a minimum value, a predetermined value or any other value as determined by those of ordinary skill in the art.

In one embodiment, a transverse resonance frequency of the resonator body 120, which is independent of the shear resonance frequency, can be separately tuned to get a flatband response within the audio band range of about 20 Hz to 20 kHz. The transverse resonance frequency, which is typically on the order of about 100 kHz, depends on the geometric dimensions of the resonator body 120, whereas the shear resonance frequency, which is typically on the order of 150-250 MHz, depends on the thickness of the resonator body 120 (typically formed from crystal). In another embodiment, the transverse resonance frequency can be set within the audio band range of 20 Hz-20 kHz in order to amplify the frequency response of the resonator body 120 with a mechanical Q value of about 100. The shear resonance quality factor is typically different from the mechanical Q value. In one embodiment, the shear resonance quality factor is orders of magnitude higher (typically greater than about $10^5$) than the mechanical Q value (typically $10^2$). A thinner piezoelectric resonator body 120 may be desired in some embodiments in order to increase mechanical compliance in the transverse direction. Larger displacements of the resonator body 120 result in larger frequency/amplitude shift.

Figure 4:
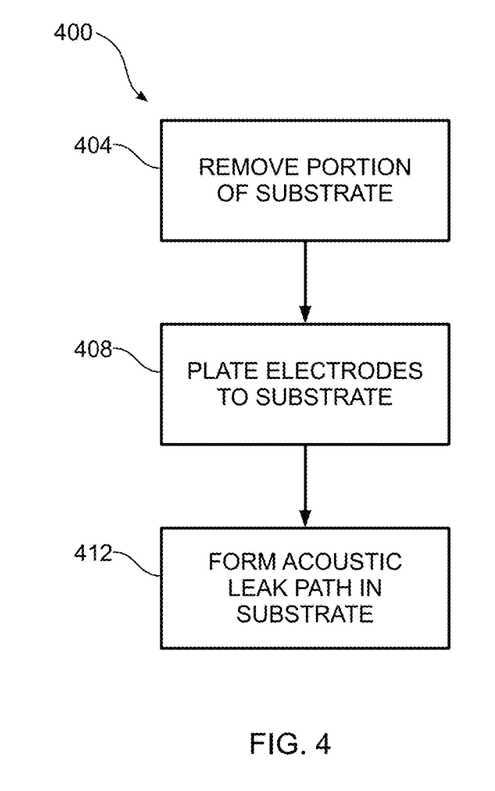
FIG. 4 is a process diagram of a method of producing a MEMS microphone such as the MEMS microphone of FIG. 1A.
Figure 5A:
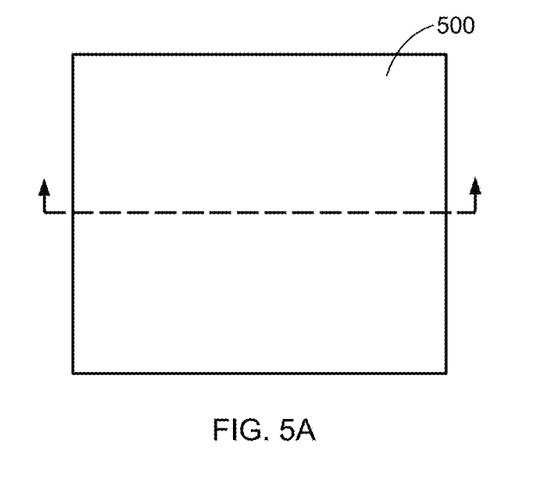
FIG. 5A is a top view of a substrate blank in the process of FIG. 4.
Figure 5B:
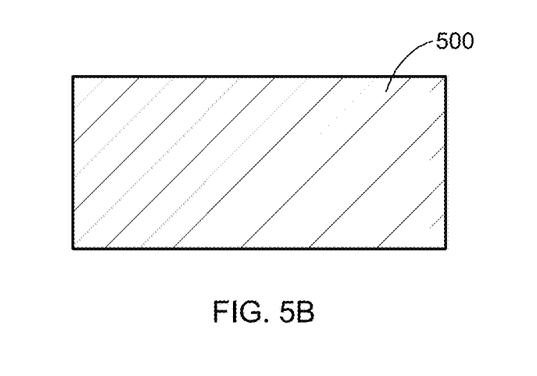
FIG. 5B is a side cross-sectional view of the substrate blank in the process of FIG. 4.

Moving to FIG. 4, a process 400 is illustrated for making a MEMS microphone, for example the MEMS microphone 100 of FIGS. 1A and 1B. FIGS. 5A and 5B illustrate a substrate blank 500, for example an AT cut quartz crystal wafer, on which the process 400 is performed. In one embodiment, the substrate blank has a thickness of approximately 100 microns, though the substrate blank can have a different thickness in other embodiments.

Figure 6A:
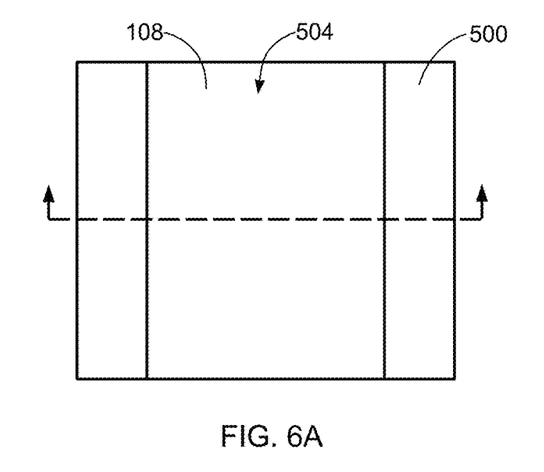
FIG. 6A is a top view of the substrate of FIG. 5A after etching a region out of the blank to form a thin substrate portion according to the process of FIG. 4.
Figure 6B:
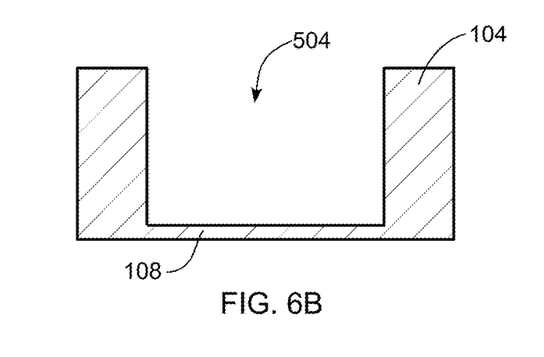
FIG. 6B is a side cross-sectional view of the substrate of FIG. 5A after etching the region out of the blank to form the thin substrate portion according to the process of FIG. 4.

Referring now to FIGS. 6A and 6B, with continued reference to FIG. 4, the process 400 begins with removing a portion of the substrate blank 500 to define a trenched region 504 in the substrate (block 404) and leaving the thin substrate portion 108 and the support body 104. In some embodiments, the removal of the portion to form the trenched region 504 is performed using an etching process, for example in a reactive ion etching ("RIE") process such as the process disclosed in U.S. Patent Publication No. 2014/0166618 to Tadigadapa et al., the contents of which are incorporated herein by reference in their entirety. In one particular embodiment, approximately 92 microns to approximately 93 microns are removed, leaving the thin substrate portion 108 with a thickness of between approximately 7 microns and approximately 8 microns, though the reader should appreciate that the thin substrate portion 108 may have another desired thickness in other embodiments.

Figure 7A:
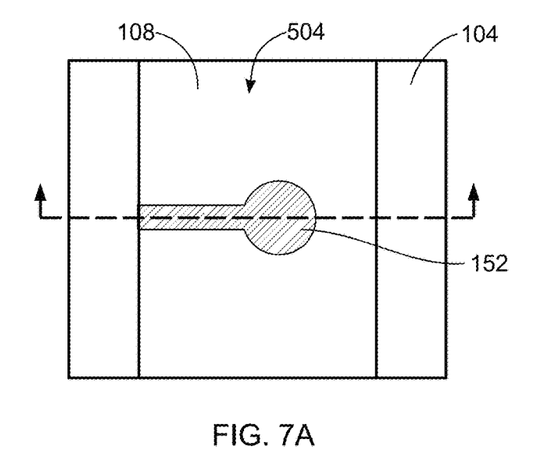
FIG. 7A is a top view of the substrate after plating electrodes onto the top and bottom of the thin substrate portion according to the process of FIG. 4.
Figure 7B:
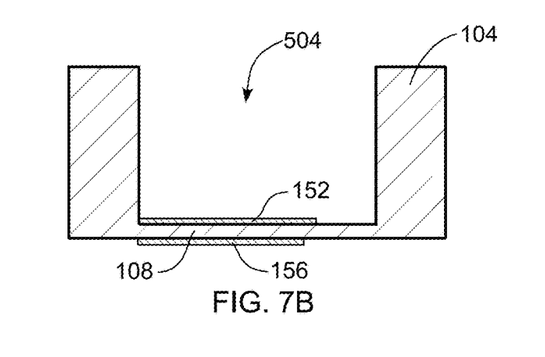
FIG. 7B is a side cross-sectional view of the substrate after plating the electrodes onto the top and bottom of the thin substrate portion according to the process of FIG. 4.

With reference to FIGS. 4, 7A, and 7B, the electrodes 152, 156 are subsequently plated on the top and bottom sides, respectively, of the thin substrate portion 108 (block 408). The electrodes 152, 156 may be formed on the thin substrate portion 108 in any suitable process, for example spray coating, electrodeposition, physical vapor deposition ("PVD"), chemical vapor deposition ("CVD") or the like. The electrodes 152, 156 are each formed having a circular portion and an elongated portion that extends from the circular portion toward the support body 104 of the substrate.

Referring now to FIGS. 1A, 1B, and 4, the opening for the acoustic leak path 140 is formed around the electrodes 152, 156 in the thin substrate portion 108 (block 412), defining the piezoelectric resonator body 120 and the connecting portion 124, which connects the piezoelectric resonator body 120 to the base portion 116 in a cantilevered manner. In one embodiment, the acoustic leak path 140 is formed in a focused ion beam ("FIB") process. In another embodiment, the acoustic leak path is formed in a laser micromachining process. In some embodiments, the acoustic leak path 140 is substantially circular, and encloses an angular region of between approximately 300 degrees and approximately 350 degrees. In another embodiment, the acoustic leak path is formed substantially as a square, a rectangle, or another desired shape such that the acoustic resonator body 120 also has a square, rectangular, or other desired shape.

While the process 400 illustrated shows the acoustic leak path (block 412) being formed after plating the electrodes (block 408), the reader should appreciate that in some embodiments, the acoustic leak path is formed before the electrodes are plated onto the resonator body.

Figure 9:
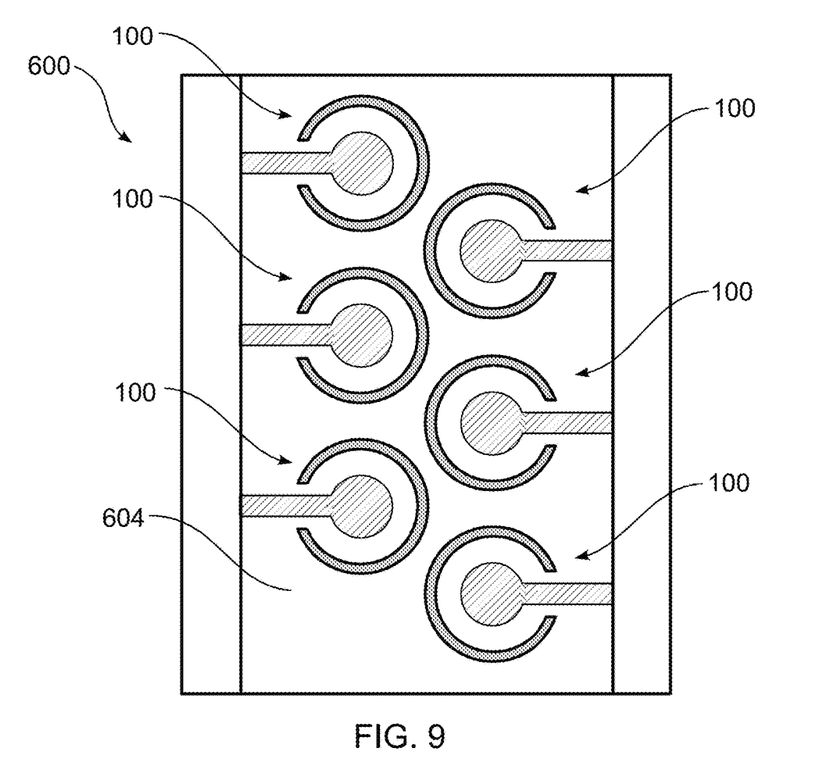
FIG. 9 is a top view of a microphone package having a plurality of the MEMS microphones of FIG. 1A.

According to another embodiment of the disclosure, FIG. 9 illustrates a MEMS microphone package 600 includes a plurality of MEMS microphones 100. The MEMS microphone package includes a thin substrate portion 604, for example AT cut quartz, in which the plurality of MEMS microphones 100 are produced. The embodiment illustrated in FIG. 9 includes six MEMS microphones 100, though the reader should appreciate that another suitable number of MEMS microphones 100 may be used in other embodiments.

The MEMS microphone 100 according to the disclosure is robust to dust and other particulates being on the resonator body 120. A dust particle located on the resonator body 120 affects the initial, or baseline, shear resonance frequency. However, since the present disclosure determines the sound characteristics based on the shift of the resonance frequency from the baseline frequency, a change in the initial or baseline shear resonance frequency will not appreciably affect the determination of the sound characteristics.

Moreover, AT cut quartz has a high quality factor. As a result, the embodiments using AT cut quartz result in the resonator body 120 being sensitive to small shifts in the resonance frequency, thereby resulting in the MEMS microphone 100 being sensitive to weak sound waves. Additionally, the AT cut quartz has low temperature sensitivity, advantageously providing for sound detection of the MEMS microphone 100 being accurate at a wide temperature range.

The microphone 100 disclosed herein offers advantages over known piezoelectric-based MEMS microphones. The typical transduction method used for piezoelectric-based MEMS microphones is based on the change in voltage/charge that occurs when piezoelectric material interacts with sound waves. Whereas, the microphone 100 senses sound waves using the force-frequency effect, which is based on detecting a shift in at least the shear resonance frequency of the high quality factor resonator body 120 as a result of sound waves deflecting the resonator body 120 from a relaxed position. The amplitude of the frequency shift is based on the amplitude of deflection of the resonator body 120. Using the principle of force-frequency effect, the microphone 100 overcomes many of the shortcomings of the typical piezoelectric-based MEMS microphones. Specifically, the microphone 100 is robust against dust and particles and is less affected by intrinsic and viscous (acoustic) damping. The microphone 100 achieves this robustness, because sound waves are detected based on the change in frequency. In other words, the resonant frequency of the resonator body 120 has a baseline frequency (also referred to as an initial frequency) as detected by the control circuit 220. The sound waves imparted on the microphone 100 change the resonant frequency from the baseline frequency. If the baseline frequency changes over time as a result of dust particles or material degradation, the signal to noise ratio and the sensitivity are not affected because the control circuit 220 updates to detect the sounds waves based on the current baseline frequency.

It will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the foregoing disclosure.

The invention claimed is:

1. A MEMS microphone comprising
a base structure;
a piezoelectric resonator body having a first end and a second end, the first end being fixedly supported by the base structure and the second end being free such that the piezoelectric resonator is cantilevered from the base structure;
a first electrode operably connected to the piezoelectric resonator body;
a second electrode operably connected to the piezoelectric resonator body;
a controller including at least one circuit operably connected to the first and second electrodes, the controller configured to drive the piezoelectric resonator body at a shear resonance frequency of the piezoelectric resonator body and to detect a frequency shift in the shear resonance frequency from a baseline resonance frequency, the detected frequency shift resulting from a sound pressure acting on the piezoelectric resonator body.

2. The MEMS microphone of claim 1, wherein:
the piezoelectric resonator body is formed in a plane; and
the controller is configured to drive the piezoelectric resonator body to resonate in the plane of the piezoelectric resonator body.

3. The MEMS microphone of claim 2, wherein the piezoelectric resonator body is configured such that the sound pressure deflects the piezoelectric resonator body at least partially out of the plane, causing the frequency shift in the shear resonance frequency from the baseline resonance frequency.

4. The MEMS microphone of claim 1, wherein the piezoelectric resonator body and the base structure are integrally formed from a common substrate.

5. The MEMS microphone of claim 1, wherein an acoustic leak path is defined separating the second end of the piezoelectric resonator body from the base structure.

6. The MEMS microphone of claim 5, wherein the acoustic leak path is defined having an arcuate shape, and the acoustic leak path surrounds an arc of between approximately 300 degrees and approximately 350 degrees around the piezoelectric resonator body.

7. The MEMS microphone of claim 1, wherein the piezoelectric resonator body is formed of AT cut quartz crystal.

8. The MEMS microphone of claim 1, wherein the first electrode is plated on a first side of the piezoelectric resonator body and the second electrode is plated on a second opposite side of the piezoelectric resonator body.

9. The MEMS microphone of claim 8, wherein the first and second electrodes each include a circular electrode portion, and the circular electrode portion of the first electrode has a different surface area than the circular electrode portion of the second electrode.

10. The MEMS microphone of claim 1, wherein the first and second electrodes are at least partially formed of one of platinum, chrome, and gold.

11. The MEMS microphone of claim 1, wherein the controller includes one of an impedance circuit and an oscillator circuit configured to drive the piezoelectric resonator body.

12. The MEMS microphone of claim 1, wherein the controller includes a frequency to voltage converter configured to detect the frequency shift in the resonance frequency from the baseline resonance frequency caused by the sound pressure.

13. The MEMS microphone of claim 1, wherein the controller is further configured to track admittance or scattering parameters to determine a characteristic of the sound pressure from the determined frequency shift in the resonance frequency from the baseline resonance frequency.

14. A method of producing a microphone comprising:
removing a portion of a piezoelectric substrate to form a thin substrate portion;
forming first and second electrodes on the thin substrate portion; and
defining an acoustic leak path in the thin substrate portion so as to form a piezoelectric resonator body supported at one end in a cantilevered manner by a base portion of the thin substrate portion.

15. The method of claim 14, the defining of the acoustic leak path further comprising removing a portion of the thin substrate portion with a focused ion beam.

16. The method of claim 14, the removing of the portion of the piezoelectric substrate comprising etching the piezoelectric substrate in a reactive ion etching process.

17. The method of claim 14, the forming of the first and second electrodes comprising plating the first electrode on a first side of the thin substrate portion and plating the second electrode on a second opposite side of the thin substrate portion.

18. A method of detecting sound comprising:
driving, with a controller, a piezoelectric resonator body that is supported from a base portion in a cantilevered manner to resonate at a shear resonance frequency, the piezoelectric resonator body being operably connected to the controller by a first electrode and a second electrode;
detecting, with the controller, a frequency shift, which results from sound pressure acting on the piezoelectric resonator body, of the shear resonance frequency from a baseline resonance frequency; and
determining, with the controller, at least one sound characteristic based on the detected frequency shift.

* * * * *